(12) United States Patent
Patti et al.

(10) Patent No.: US 6,362,025 B1
(45) Date of Patent: Mar. 26, 2002

(54) METHOD OF MANUFACTURING A VERTICAL-CHANNEL MOSFET

(75) Inventors: Davide Patti, Catania; Angelo Pinto, Siracusa, both of (IT)

(73) Assignee: STMicroelectronics S.r.l, Agrate Brianza (IT)

( * ) Notice: Subject to any disclaimer, the term of this patent is extended or adjusted under 35 U.S.C. 154(b) by 0 days.

(21) Appl. No.: 09/441,575

(22) Filed: Nov. 17, 1999

(30) Foreign Application Priority Data

Nov. 17, 1998 (EP) ............................................ 98830690

(51) Int. Cl.⁷ ............................................ H01L 21/332
(52) U.S. Cl. ........................................ 438/138; 438/270
(58) Field of Search ............................ 438/133, 135, 438/137, 138, 270, 243, 271, 272

(56) References Cited

U.S. PATENT DOCUMENTS

| | | |
|---|---|---|
| 4,521,795 A | 6/1985 | Coe et al. |
| 5,142,640 A | 8/1992 | Iwamatsu |
| 5,160,491 A * | 11/1992 | Mori .......................... 438/270 |
| 5,242,845 A * | 9/1993 | Baba et al. ................. 438/243 |
| 5,578,508 A | 11/1996 | Baba et al. |
| 5,627,393 A | 5/1997 | Hsu ............................. 257/331 |

FOREIGN PATENT DOCUMENTS

| | | |
|---|---|---|
| EP | 0 617 468 A1 | 3/1994 |
| GB | 2 055 247 A | 6/1980 |
| GB | 2 150 348 A | 11/1983 |

* cited by examiner

*Primary Examiner*—Tuan H. Nguyen
(74) *Attorney, Agent, or Firm*—Lisa K. Jorgenson; Allen, Dyer, Doppelt, Milbrath & Gilchrist, P.A.

(57) ABSTRACT

A submicrometer vertical-channel MOSFET of high quality and reproducibility is produced by a method compatible with DPSA technology. The method steps are performed on a wafer of semiconductor material having a layer with n conductivity. First, n impurity ions and p impurity ions are implanted in an area of the layer and the wafer is subjected to a high-temperature treatment. The impurities, the implantation doses and energies, and the high-temperature treatment time and temperature being such as to form a first p region, and a second n region which forms a pn junction with the first region. A trench is hollowed out which intersects the first region and the second regions. The method further includes forming a dielectric coating on the lateral surface of the trench, depositing electrically-conductive material in the trench in contact with the dielectric, and forming elements for electrical contact with the n conductivity layer, with the second region, and with the electrically-conductive material inside the trench, to produce drain, source and gate electrodes of the MOSFET, respectively.

10 Claims, 4 Drawing Sheets

_US 6,362,025 B1_

METHOD OF MANUFACTURING A VERTICAL-CHANNEL MOSFET

FIELD OF THE INVENTION

The present invention relates to the manufacturing of semiconductor devices, and more particularly, to manufacturing a vertical-channel MOSFET transistor.

BACKGROUND OF THE INVENTION

As is known, a vertical-channel MOSFET transistor has its source and drain regions in layers which have the same type of conductivity and which are parallel to one another and to the front surface of the wafer of semiconductor material in which the transistor is formed. These layers are separated by a body region having the second type of conductivity. The gate dielectric and the gate electrode are formed on the lateral walls of a trench hollowed out in the wafer so as to intersect the source and drain regions. The channel of the MOSFET is included in the portion of the body region delimited by the side walls of the trench.

A technique is known for the manufacture of electronic devices with high dynamic performance, i.e. with a high frequency or fast switching speed, which can achieve the very small dimensions and the extremely thin junctions necessary for such performance. Isolation between active areas of the device is achieved by the hollowing-out of narrow trenches which are filled at least partially with dielectric material (trench isolation). This technique also permits the formation of self-aligned structures with the use of two polycrystalline silicon layers and is therefore known as the "double polysilicon self-aligned" or DPSA technique.

With this technique, it is possible to produce vertical npn bipolar transistors capable of operating at transition frequencies greater than 50 Ghz. Unfortunately, up to now, this technique has not been suitable for the production of other components of equally good quality, except at the cost of process complications which involve unacceptable increased expense. For example, lateral pnp transistors can be produced without modification of the standard process, but with rather limited performance. There is therefore a need, within the scope of this technology, to produce good-quality circuit components for use in combination with the npn bipolar transistors to extend the application of this technology to the design of more complex integrated circuits.

SUMMARY OF THE INVENTION

An object of the present invention is to provide a method of manufacturing a semiconductor device comprising a vertical-channel MOSFET transistor which is compatible with the DPSA technique.

This object is achieved, according to the invention, by a method including steps performed on a wafer of semiconductor material having a layer with n conductivity. First, n impurity ions and p impurity ions are implanted in an area of the layer and the wafer is subjected to a high-temperature treatment. The impurities, the implantation doses and energies, and the high-temperature treatment time and temperature are such as to form a first p region, and a second n region which forms a pn junction with the first region. A trench is hollowed out which intersects the first region and the second region. The method further includes forming a dielectric coating on the lateral surface of the trench, depositing electrically-conductive material in the trench in contact with the dielectric, and forming elements for electrical contact with the n conductivity layer, with the second region, and with the electrically-conductive material inside the trench, to produce drain, source and gate electrodes of the MOSFET, respectively.

BRIEF DESCRIPTION OF THE DRAWINGS

The invention will be understood better from the following detailed description of an embodiment thereof given with reference to the appended drawings, in which.

DETAILED DESCRIPTION OF THE PREFERRED EMBODIMENTS

Figure 1:
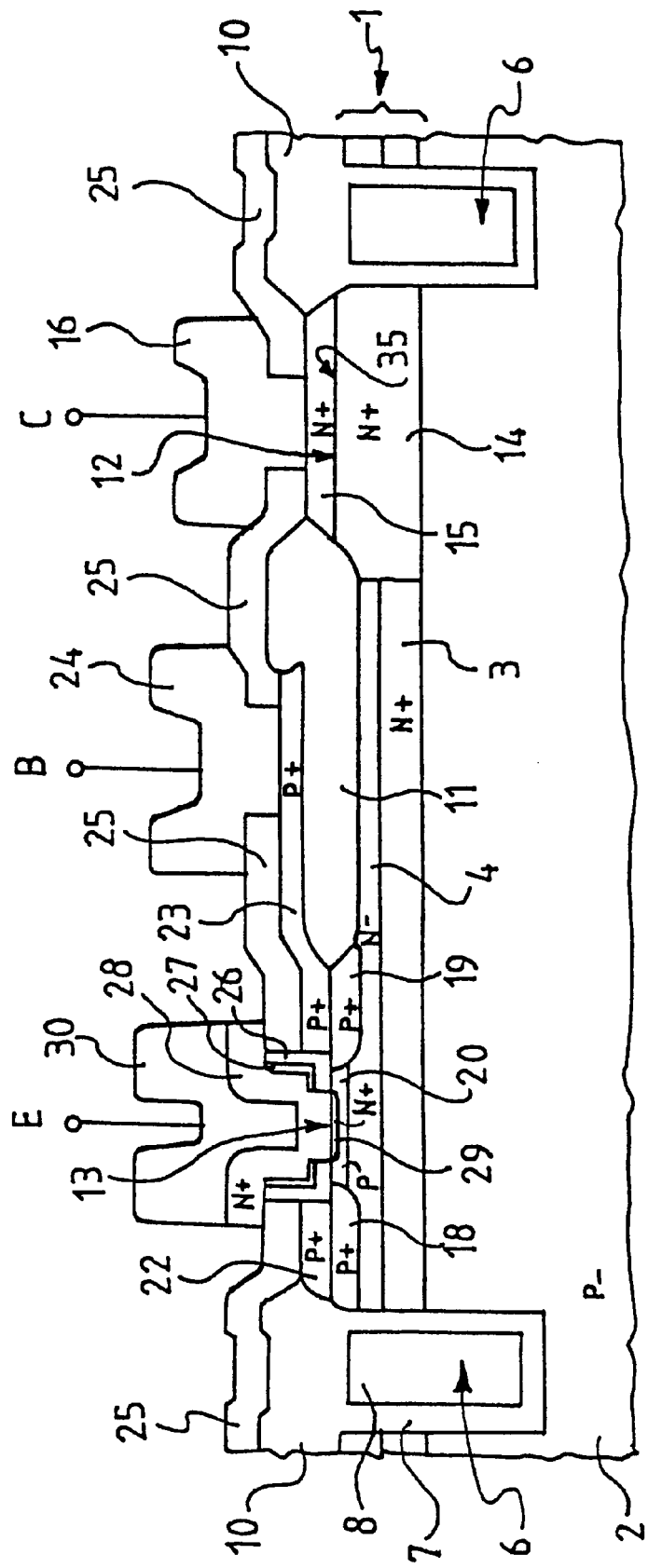
FIG. 1 is a cross-sectional view of a vertical npn transistor formed by the DPSA technique on a wafer of semiconductor material in accordance with the present invention.

FIG. 1 shows, in section, a portion of a wafer of semiconductor material, for example, monocrystalline silicon, comprising a p- substrate 2 and an n layer 1 comprising a buried n+ layer 3 and an epitaxial n- layer 4. A trench isolation structure, generally indicated 6, formed from silicon dioxide 7 and polycrystalline silicon 8, extends from the front surface 35 of the wafer as far as the substrate 2, forming a frame which encloses the structure of the vertical npn transistor, isolating it from the rest of the wafer. Layers 10 and 11 of silicon dioxide (field oxide) extend on the surface 35 and are partially embedded in the epitaxial layer 4. The layer 10 completes the isolation of the structure of the vertical npn transistor on the surface and the layer 11 delimits and isolates two areas indicated 12 and 13 from one another.

A diffused n+ region 14 (a sinker) extends from the area 12, through the epitaxial layer 4 as far as the buried layer 3 and has the function of a deep collector contact. A layer 15 of n+ doped polycrystalline silicon 15 is formed on the area 12 in contact with the sinker region 14 and a metal strip 16 is in contact with the layer 15 to form the collector electrode C of the transistor.

Two diffused p+ regions 18 and 19 extend in the epitaxial layer 14 from the area 13 and together form the so-called extrinsic base of the transistor. They are joined by a diffused p region 20 which forms the so-called intrinsic base of the transistor. Two regions 22 and 23 of p+ doped polycrystalline silicon extend on the regions 18 and 19, respectively. The regions 18 and 19 are formed by the diffusion into the epitaxial layer 4 of p-type impurities contained in the polycrystalline silicon of the regions 22 and 23. The region 23 also extends partly on the field-oxide layer 11, a metal element 24 which forms the base electrode B of the transistor being disposed above the region 23. A layer 25 of dielectric material, for example, vapor-phase deposited silicon dioxide (VAPOX) covers the polycrystalline silicon regions 15, 22 and 23, except for the contact areas of the metal collector and base electrodes 16 and 24.

The opposite side edges of the regions 22 and 23 and of the overlying portions of the silicon dioxide layer 25, and the regions of the area 13 adjacent these edges are covered by structures with L-shaped cross-sections, provided by silicon dioxide 26 and silicon nitride 27. An n+ doped polycrystalline silicon insert 28 fills the space delimited by the L-shaped structures 26 and 27 and is in contact, on the area 13, with an extremely thin n+ diffused region 29. This region is formed by diffusing n-type impurities contained in the polycrystalline silicon of the insert 28 into the intrinsic base region 20. A metal strip 30 extends on the insert 28 and forms the emitter electrode E of the transistor.

According to the invention, vertical-channel MOSFET transistors are formed by a process fully compatible with the DPSA technique. With reference to FIGS. 2a to 2m, in which the reference numerals indicating the same elements are the same as those of FIG. 1, the method of the present invention will now be described.

Figure 2A:
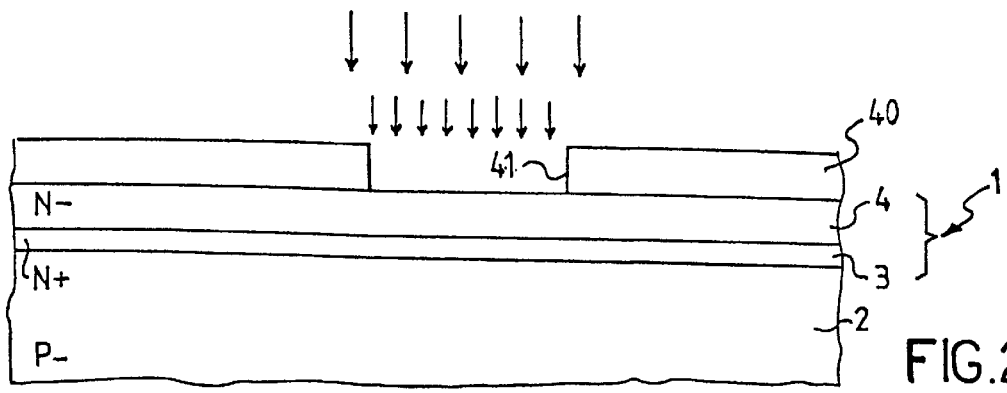
FIGS. 2a to 2m are cross-sectional views of a portion of the wafer during various successive steps of the method according to the invention for the manufacture of a vertical n-channel MOSFET transistor (to simplify the drawings and in view of the symmetry of the structure, FIGS. 2g to 2m show only a portion of the structure).
Figure 2B:
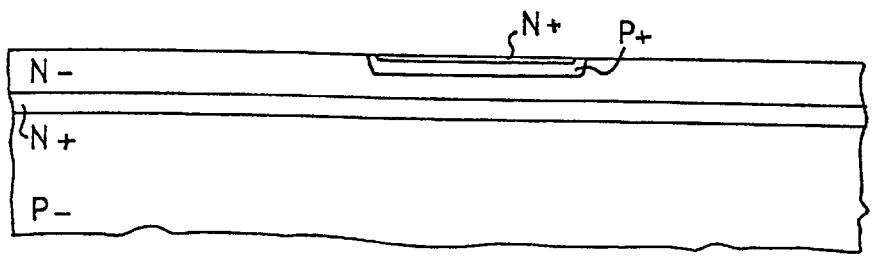

A wafer of semiconductor material ready to undergo DPSA treatment such as that for producing the npn transistor structure of FIG. 1 described above, is covered with a layer 40 of material impermeable to the ionic implantations to be performed, for example, a photoresist layer. Then a window 41 is opened in the layer 40. Next, the wafer is subjected to implantation with ions of an n-type doping impurity with low diffusivity, for example, arsenic, with a low energy, for example, 10–40 KeV and a high dose, for example, $1-5 \cdot 10^{15}$ atoms/cm$^2$, and to implantation with ions of a p-type doping impurity with a high energy, for example, 80–250 KeV and a medium dose, for example, $1-7 \cdot 10^{13}$ atoms/cm$^2$ (FIG. 2a).

Figure 2C:
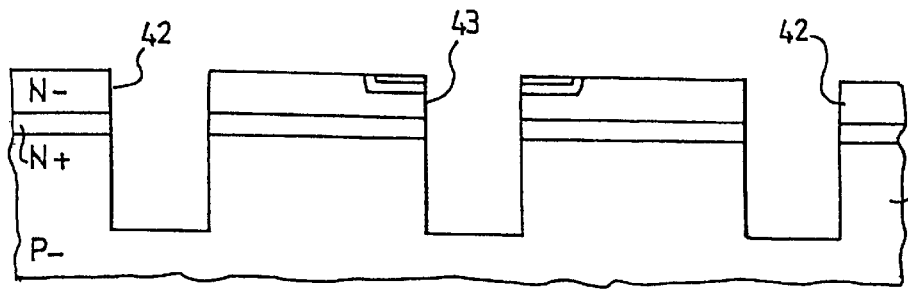

After the removal of the photoresist layer (FIG. 2b), the wafer is subjected to selective dry etching of the silicon in accordance with the standard DPSA method to hollow out an isolation trench 42 and a gate trench 43, for example 1 $\mu$m wide, extending from the front surface into the substrate 2, for example, to a depth of 6 $\mu$m, as shown (not to scale) in FIG. 2c. The isolation trench 42 extends as a rectangular frame in plan view and delimits within it a portion of silicon which is to contain the vertical-channel MOSFET transistor. The gate trench 43 extends, in plan view, along the centerline of the rectangular portion of silicon, naturally without touching the isolation trench 42

Figure 2D:
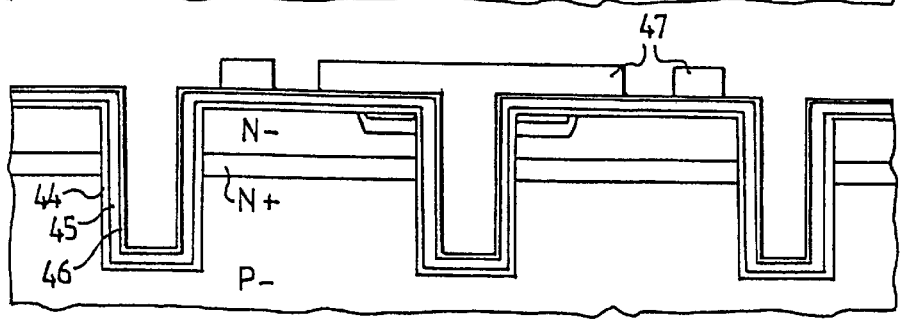
Figure 2E:
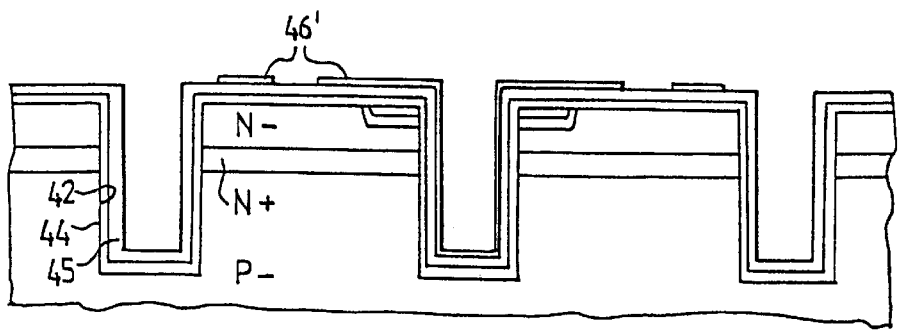

The wafer is subjected to a high-temperature treatment (for example, at 920° C. for 60–120 min.) in an oxidizing atmosphere so as to form a thin (for example, 10 nm) layer 44 of silicon dioxide to define the gate dielectric. A layer 45 of polycrystalline silicon (for example 0.25 $\mu$m thick) is then deposited and, on top of this, a layer 46, for example, of the same thickness, of silicon nitride is deposited (FIG. 2d). A photoresist mask 47 is formed by a normal photolithographic process (FIG. 2d). The portions of the nitride which are not covered by the mask are removed by chemical etching and the mask 47 is removed so that only the portions 46' of the layer 46 which were protected by the mask remain (FIG. 2e).

Figure 2F:
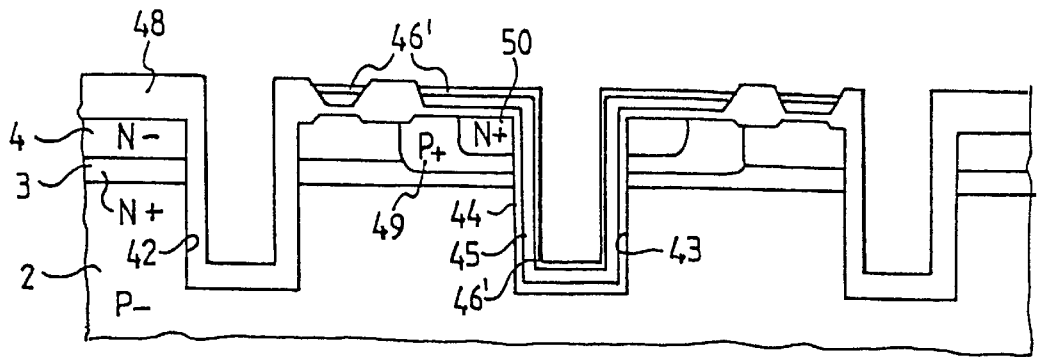
Figure 2G:
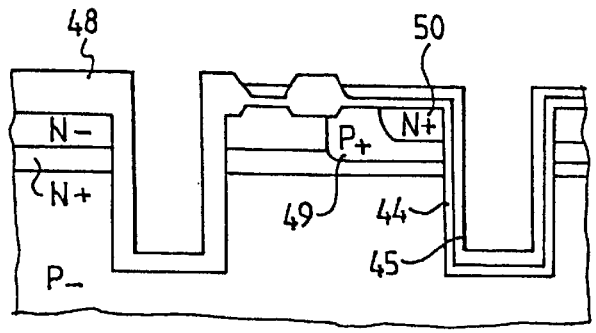
Figure 2H:
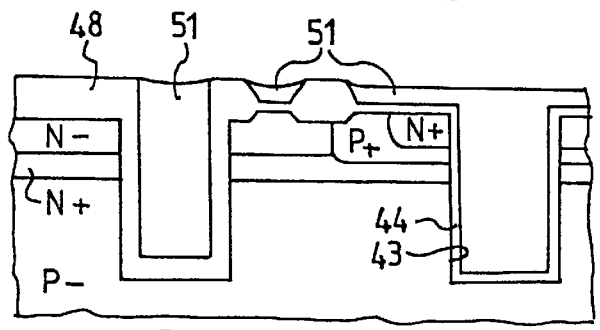

The wafer is subjected to a high-temperature treatment (for example, at 950° C. for 60–120 min.) in an oxidizing atmosphere, which causes the growth of a relatively thick layer (for example 0.3 $\mu$m) of silicon dioxide on the portions of the wafer which are not covered by the nitride 46', including the walls of the isolation trench 42 (FIG. 2f). In this step, all of the uncovered polycrystalline silicon is transformed into silicon dioxide and the doping impurities implanted in the monocrystalline silicon diffuse to form a p+ region, indicated 49, which forms a pn junction with the buried n+ layer 3, and an n+ region, indicated 50, which forms a pn junction with the region 49 and is delimited by the front surface of the wafer. The regions 49 and 50 define the body region and the source region of the MOSFET transistor, respectively, and are intersected by the side walls of the gate trench 43. The nitride layer 46' is removed by chemical etching (FIG. 2g), and n-doped polycrystalline silicon, indicated 51, (doped, for example, with arsenic) is deposited until the trenches are completely filled. The wafer is then subjected to controlled dry etching to remove the polycrystalline silicon until the field oxide 48 is uncovered (FIG. 2h).

Figure 2I:
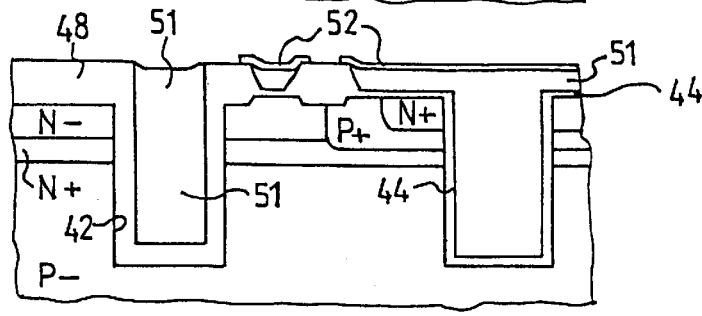
Figure 2J:
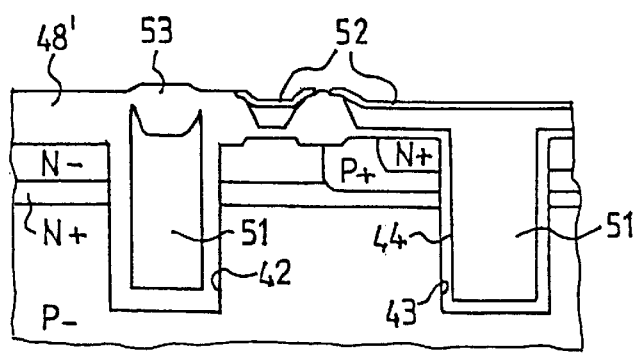
Figure 2K:
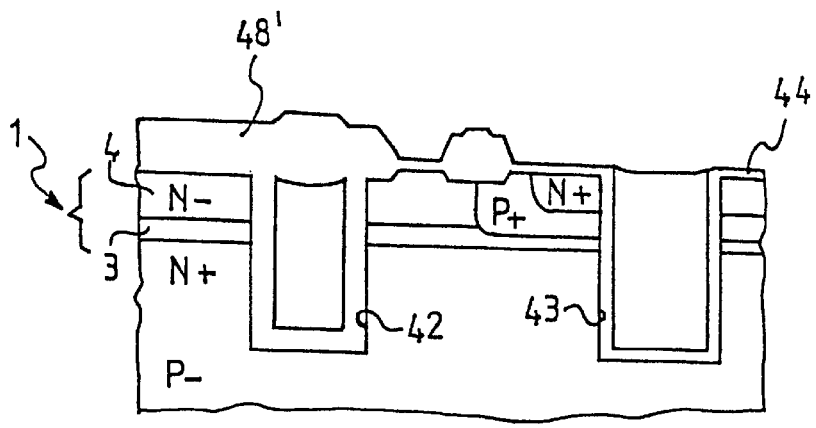

A further layer 52 of silicon nitride is deposited and is removed by photolithography over the field oxide 48 and over the isolation trench 42 (FIG. 2i). The wafer is subjected to a high-temperature treatment (for example, at 1000° C. for 60–100 min.) in an oxidizing atmosphere so as to cause the growth of a "cap" 53 of silicon dioxide on the polycrystalline silicon of the isolation trench 42 and to increase the thickness of the field oxide, indicated 48' in FIG. 2j and in the following figures. The residual nitride 52 is removed by chemical etching and a underlying polycrystalline silicon 51 is removed in a controlled manner by further chemical etching until the portion of the silicon dioxide layer 44 which is on the front surface of the wafer is uncovered. After this operation, the level of the polycrystalline silicon which is in the gate trench 43 is substantially aligned with the front surface of the wafer (FIGS. 2k).

Figure 2L:
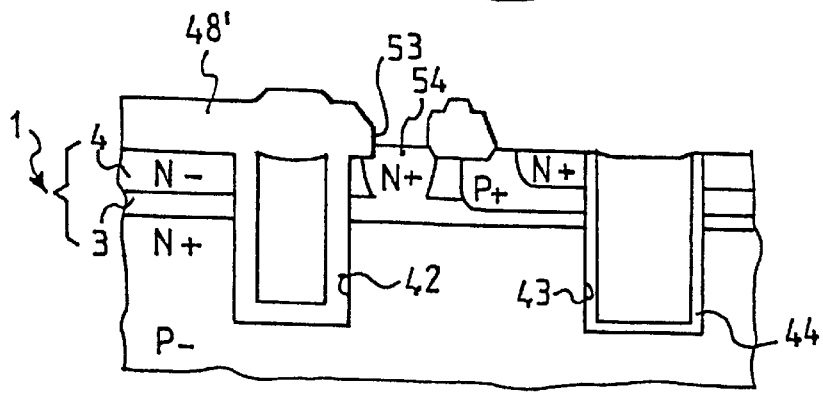

A window 53 is opened in the oxide 48', above the epitaxial n− layer 4 by a photolithographic process and an n+ deep contact (sinker) region 54 which reaches the buried n+ layer 3 is formed by implantation of ions of an n-type doping impurity, for example, phosphorus. The silicon dioxide layer 44 is removed from the front surface of the wafer and the resulting structure is shown in FIG. 2l.

Figure 2M:
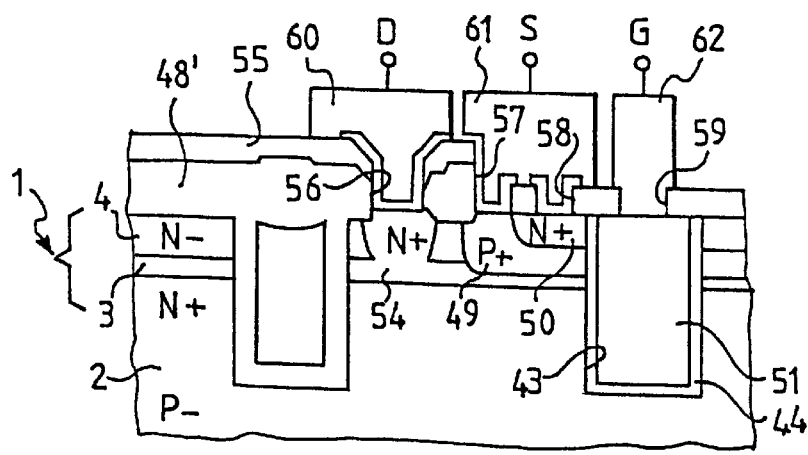

A silicon dioxide layer 55 is formed by vapor-phase deposition (VAPOX) and then, with the use of the normal steps of the DPSA technique, elements are formed for electrical contact with the sinker region 54 to produce the drain electrode D of the MOSFET, with the n+ region 50 to produce the source electrode S of the MOSFET, and with the doped, and hence electrically-conductive, polycrystalline silicon 51 of the gate trench 43, to produce the gate electrode G of the MOSFET. In this embodiment, the source contact element is also in contact with the p+ body region 49 and the resulting structure is shown in FIG. 2m. The VAPOX layer 55 in which windows 56, 57, 58, 59 are formed for the drain, body, source and gate contacts, respectively, can be recognized therein. Inside the drain, body and source windows 56, 57 and 58 there is a thin layer of doped polycrystalline silicon produced by the same process steps which are necessary to produce the layer 15 or the insert 28 of n+ doped polycrystalline for the collector or emitter contact, respectively, of the npn transistor such as that shown in FIG. 1. Metal strips 60, 61, 62 are formed by the same process steps which are necessary to form the emitter, base and collector electrodes of the npn transistor of FIG. 1.

A vertical-channel MOSFET transistor is thus produced with only slight modification of the standard DPSA process. Indeed, the only steps to be added are the photolithography steps to define the area for the implantation of the body and source regions and the implantations themselves. By suitable selection of the implantation parameters, i.e. the doping species to be implanted, and the implantation doses and energies, as well as the times and the temperatures of the heat treatments to which the wafer is subjected during the process as a whole, it is possible to produce channels of submicrometer length (for example 0.2 $\mu$m) with optimal precision and repeatability. Naturally, precise control of the parameters for the formation of the epitaxial layer 4 is also necessary. Since all of these parameters can be controlled very accurately, the resulting vertical-channel MOSFET structures can be reproduced equally accurately.

The method described above illustrates the invention used within the scope of DPSA technology. However, the invention may also advantageously be implemented independently of this technology when it is necessary to form vertical-channel MOSFET transistors with submicrometer channels.

Although the method according to the invention has been described with reference to an example in which an n-type vertical-channel MOSFET transistor is produced, clearly the method can also be used to produce p-type vertical-channel MOSFET transistors, simply by forming drain, body and source regions with conductivities complementary to those of the example described. Naturally, pairs of complementary vertical-channel MOSFET transistors can also be formed together.

What is claimed is:

1. A method of manufacturing a semiconductor device comprising a vertical-channel MOSFET transistor on a wafer of semiconductor material having a layer with a first conductivity type delimited by a front surface of the wafer, the method comprising the steps of:

implanting impurity ions of the first conductivity type and a second conductivity type in an area on the front surface of the wafer and subjecting the wafer to a high-temperature treatment, the impurities of the first conductivity type and of the second conductivity type, implantation doses and energies, and the high-temperature treatment time and temperature being selected such as to form a first region with the second conductivity type which forms a pn junction with the rest of the layer, and a second region with the first conductivity type which forms a pn junction with the first region and is delimited by the front surface;

forming isolation trenches in the wafer, for isolating the vertical-channel MOSFET transistor from adjacent components of the semiconductor device, and while simultaneously forming a trench in the wafer which intersects the first region and the second region with at least one lateral surface thereof;

forming a dielectric layer on the at least one lateral surface of the trench which intersects the first and second regions;

depositing electrically-conductive material in the trench and in contact with the dielectric layer;

forming a deep contact region on the front surface of the wafer and reaching the layer with the first conductivity type; and forming contact elements for electrical contact, respectively, with the deep contact region, with the second region, and with the electrically-conductive material inside the trench, to produce drain, source and gate electrodes of the MOSFET, respectively.

2. A method according to claim 1, wherein the contact element for electrical contact with the second region is also in electrical contact with the first region.

3. A method of manufacturing a semiconductor device comprising a vertical-channel MOSFET transistor, the method comprising the steps of:

forming a layer having a first conductivity type on a semiconductor wafer;

implanting impurity ions of a second conductivity type in the layer to form a first region defining a pn junction with the layer;

implanting impurity ions of the first conductivity type in the layer to form a second region defining a pn junction with the first region;

forming isolation trenches in the wafer, for isolating the vertical-channel MOSFET transistor from adjacent components of the semiconductor device, and while simultaneously forming a trench in the wafer which intersects the first region and the second region with at least one lateral surface thereof;

forming a dielectric layer on the at least one lateral surface of the trench;

forming a conductive layer in the trench and in contact with the dielectric layer;

forming a deep contact region in the wafer and reaching the layer;

forming a first contact element for electrical contact with the deep contact region to define a drain electrode of the MOSFET;

forming a second contact element for electrical contact with the second region to define a source electrode of the MOSFET; and forming a third contact element for electrical contact with the the conductive layer to define a gate electrode of the MOSFET.

4. A method according to claim 3, wherein the second contact element is also in electrical contact with the first region.

5. A method of manufacturing a semiconductor device comprising a vertical-channel MOSFET transistor, the method comprising the steps of:

implanting impurity ions of a first conductivity type in a layer having a second conductivity type on a semiconductor wafer to form a first region;

implanting impurity ions of the second conductivity type in the layer to form a second region;

forming isolation trenches in the wafer, for isolating the vertical-channel MOSFET transistor from adjacent components of the semiconductor device, and while simultaneously forming a trench in the wafer through the first region and the second region;

forming a dielectric layer in the trench;

forming a conductive layer in the trench and in contact with the dielectric layer;

forming a deep contact region in the wafer and reaching the layer; and forming contact elements for electrical contact with the deep contact region, the second region and the conductive layer to define respective electrodes of the MOSFET.

6. A method according to claim 5, wherein the contact element for electrical contact with the second region is also in electrical contact with the first region.

7. A method according to claim 5, wherein the step of implanting impurity ions of the first conductivity type comprises implanting impurity ions at an energy between 10–40 KeV.

8. A method according to claim 7, wherein the step of implanting impurity ions of the second conductivity type comprises implanting impurity ions at an energy between 80–250 KeV.

9. A method according to claim 5, wherein the step of implanting impurity ions of the first conductivity type comprises implanting impurity ions at a concentration between $1-5 \times 10^{15}$ atoms/cm$^2$.

10. A method according to claim 9, wherein the step of implanting impurity ions of the second conductivity type comprises implanting impurity ions at a concentration between $1-7 \times 10^{13}$ atoms/cm$^2$.

* * * * *